Aug. 5, 1969 G. A. MAY 3,459,974
HIGH SPEED BINARY FLIP-FLOP
Filed Oct. 21, 1965
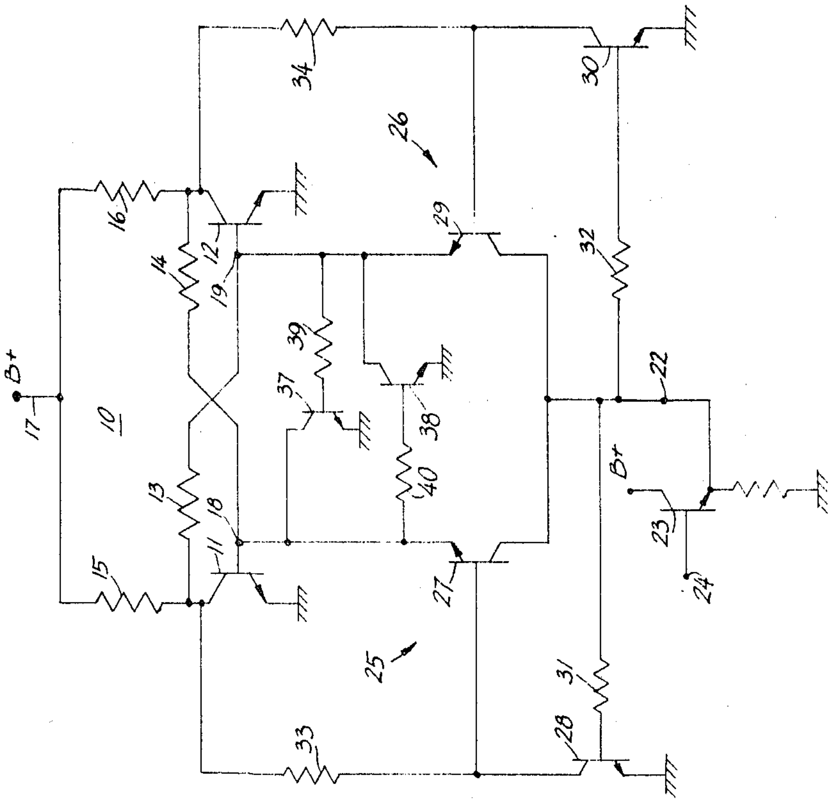
INVENTOR
George A. May
BY
James A. Lamb
PATENT AGENT

United States Patent Office 3,459,974 Patented Aug. 5, 1969

3,459,974

HIGH SPEED BINARY FLIP-FLOP

George A. May, Ottawa, Ontario, Canada, assignor to Northern Electric Company Limited, Montreal, Quebec, Canada Filed Oct. 21, 1965, Ser. No. 500,000
Int. Cl. H03k 3/286
U.S. Cl. 307—292 4 Claims

ABSTRACT OF THE DISCLOSURE

A transistor flip-flop circuit in which trigger pulses are supplied to the bistable circuit through steering gates. Additional transistors are connected between the base of each transistor in the bistable circuit and ground. These additional transistors are enabled selectively by the trigger pulse to provide a low impedance path to ground and assist in turning off the related transistor in the bistable pair.

This invention relates to a high speed binary flip-flop and, in particular, to a high speed binary flip-flop to be manufactured by integrated circuit techniques.

A common form of basic switching circuit used in binary flip-flops is a transistor bistable circuit which consists of a pair of transistors interconnected so that when one is conducting the voltage at its output is applied to the input of the other transistor to maintain the latter in a non-conducting state. The interconnection of the transistors forms a regenerative feedback loop so that when one of the transistors is being switched from a non-conducting to a conducting state the switching effect is propagated via the feedback loop to the other transistor to switch it from a conducting to a non-conducting state. The speed of switching is limited by propagation delays in the feedback loop and it is usual to provide capacitive coupling in the feedback loop to increase the speed of switching. It is, however, difficult to manufacture capacitors in integrated circuitry and the circuit of this invention provides a high speed flip-flop which does not require capacitive coupling.

Conventional bistable circuits are dependent for correct switching on the applied trigger pulses being of a preassigned duration. If the trigger pulse is too long the bistable circuit may change state several times during the trigger pulse. If the trigger pulse is too short, the bistable circuit may not change state at all. This latter effect may be caused by the finite time necessary to remove the stored charge in the base of the conducting transistor exceeding the duration of the trigger pulse. The circuit of this invention provides a high speed flip-flop which is responsive to trigger pulses having a wide range of pulse widths.

It is an object of this invention to provide a high speed binary flip-flop of novel design.

It is a further object of this invention to provide a novel high speed binary flip-flop adapted to be manufactured by integrated circuit techniques.

It is a further object of this invention to provide a novel high speed binary flip-flop which is responsive to trigger pulses having a wide duration of pulse widths.

Briefly, the binary flip-flop of this invention comprises a conventional transistor bistable circuit to which trigger pulses are supplied through one of two parallel steering gates. The steering gates, which are connected to a trigger or clock pulse input terminal, are selectively enabled by connections to the bistable circuit to supply a trigger pulse to the base of the OFF transistor. A pair of electronic switches are provided, connected one to each of the bases of the transistors in the bistable circuit, so that when one of the switches is energized, the base of the corresponding transistor in the bistable circuit is connected to ground potential, that is to the reference potential of the bistable circuit.

The control electrode of each electronic switch is connected to the base of the opposite transistor so that when the base of the OFF transistor is supplied with a trigger pulse, the base of the ON transistor is grounded via its corresponding electronic switch.

A further feature of this invention resides in making the electronic switches transistors having the same stored charge characteristics as the transistors used in the binary circuit. This results in the electronic switch transistor connected to the ON transistor of the bistable circuit remaining in conduction for the same period of time as the ON transistor even though the trigger pulse is of very short duration.

Other features and objects of this invention will become apparent from the following description of a specific circuit embodying the invention taken in conjunction with the accompanying drawing which is a schematic circuit diagram of the high speed binary flip-flop.

Referring to the drawing, a conventional transistor bistable circuit 10 is formed by NPN transistors 11 and 12. Transistors 11 and 12 operate in common emitter configuration and the base of each transistor is cross-connected to the collector of the other by resistors 13 and 14. Transistors 11 and 12 are biased for operation by a positive supply voltage applied to a terminal 17 and coupled to the collector of transistor 11 by resistor 15 and to the collector of transistor 12 by resistor 16.

The operation of bistable circuit 10 is well known. The circuit has a first stable state with transistor 11 conducting and transistor 12 non-conducting and a second state with transistor 11 non-conducting and transistor 12 conducting. When a positive pulse is applied to the base of transistor 12 during the first state of the bistable circuit, that transistor begins to conduct and the resulting reduction of voltage on its collector is applied to the base of transistor 11 via resistor 14. The regenerative feedback loop formed by transistors 11 and 12 and resistors 13 and 14 causes the bistable circuit to switch to its second stable state. Similarly, a positive pulse applied to the base of transistor 11 during the second stable state causes the bistable circuit to switch to its first stable state. For convenience in subsequent description the bases of transistors 11 and 12 will be considered as forming first and second input terminals 18 and 19, respectively, for the bistable circuit.

A trigger input terminal for the flip-flop circuit is shown at 22 and is adapted to receive trigger pulses which may be supplied from a source of pulses (not shown) through terminal 24 and emitter follower 23. Trigger input terminal 22 is connected to first and second input terminals 18 and 19 by steering gates 25 and 26, respectively.

Steering gate 25 comprises two transistors 27 and 28. Transistor 27 has its collector connected to terminal 22 and its emitter connected to terminal 18. Thus, terminals 22 and 18 are connected together by the collector-emitter path of transistor 27. Transistor 28 has its collector-emitter path connected between the base of transistor 27 and a point of reference potential designated by the conventional symbol. The base of transistor 28 is connected to terminal 22 via resistor 31. Biasing voltage for the operation of steering gate 25 is supplied by resistor 33 connected between the collector of transistor 11 and the base of transistor 27.

Steering gate 26 is identical in structure to steering gate 25 and comprises transistors 29 and 30. Transistors 29 has its collector connected to trigger input terminal 22 and its emitter connected to terminal 19. Transistor 30 has its collector connected to the base of transistor 29 and its emitter connected to a point of reference potential. The base of transistor 30 is connected to terminal 22 via resistor 32. Biasing voltage for the operation of steering gate 26 is supplied by resistor 34 connected between the collector of transistor 12 and the base of transistor 29.

In the circuit arrangement so far described, steering gates 25 and 26 are enabled only when the respective collector of transistors 11 and 12 assumes a positive voltage. Since these collectors assume a positive voltage at mutually exclusive times only one of the steering gates is enabled at any time.

When steering gate 25 is enabled, transistor 27 is biased into conduction and its collector-emitter path couples the trigger input terminal 22 to input terminal 18 of the bistable circuit. Similarly, when steering gate 26 is enabled, transistor 29 is biased into conduction and couples trigger input terminal 22 to input terminal 19 of the bistable circuit.

The complementing action of the flip-flop in response to trigger pulses applied to terminal 22 will be readily apparent. When bistable circuit 10 is in its first stable state, with transistor 11 conducting and transistor 12 non-conducting, the collector of transistor 12 is at a positive voltage and steering gate 26 is enabled. The next occurring trigger pulse at terminal 22 is coupled via steering gate 26 to terminal 19 of the bistable circuit. This positive pulse applied to the base of transistor 12 turns on the transistor and the bistable circuit switches to its second stable state with transistor 12 conducting and transistor 11 non-conducting. When the bistable circuit switches to its second stable state steering gate 25 is enabled to apply the next occurring trigger pulse to terminal 18 of the bistable circuit and thus returned the bistable circuit to its first stable state.

Transistors 28 and 30 perform the function of shortening the duration of the trigger pulse applied to the bistable circuit 10. Considering the action of transistor 28 in steering gate 25, the positive trigger pulse is coupled to the base of transistor 28 via resistor 31. Transistor 28 will turn on after a delay determined by the time constant of the circuit formed by resistor 31 and the capacitances associated with the base-emitter junction of transistor 28. This results in the base of transistor 27 being coupled to ground via the collector-emitter path of transistor 28 thereby turning off transistor 27. The trigger pulse being supplied to terminal 18 of the bistable circuit ceases when transistor 27 has been turned off. Thus, the duration of the trigger pulse supplied to terminal 18 is determined by the sum of the delay in turning on transistor 28 and the delay in turn-off transistor 27. The action of transistor 30 in shortening the duration of the trigger pulse applied to terminal 19 of the bistable circuit is identical to the action of transistor 28 described above.

The circuit which has been described so far, is capable of functioning as a complementing flip-flop in response to trigger pulses applied to input terminal 22. The speed of response of such a flip-flop would be slow, being limited by a combination of two factors. The first factor is the delay necessary to remove the stored charge from the conducting transistor as it is switched out of the saturated mode. The second factor is the absence of coupling capacitors shunting resistors 13 and 14, such capacitors would speed up the response of the regenerative feedback loop and assist in the removal of the stored charge.

To increase the speed of response of the flip-flop two additional transistors 37 and 38, functioning as electronic switches, are provided. Transistor 37 has its emitter connected to ground potential and its collector connected to terminal 18 of the bistable circuit. The base of transistor 37 is connected to terminal 19 by a resistor 39. Transistor 38 has its emitter connected to ground potential and its collector connected to terminal 19. The base of transistor 38 is connected to terminal 18 by a resistor 40.

The presence of transistors 37 and 38 modifies the action of the flip-flop by providing a low impedance path to ground from the base of the conducting transistor when it is being switched out of saturation. This results in the stored charge of the conducting transistor being removed with a minimum of delay.

Consider the bistable circuit to be in its first stable state with transistor 12 non-conducting and hence, steering gate 26 enabled. The next occurring positive trigger pulse is coupled from terminal 22 via steering gate 26 to terminal 19 of the bistable circuit and switches transistor 12 to a conducting condition. Simultaneously, the pulse applied to terminal 19 is also applied to the base of transistor 37 and switches this transistor into conduction. The collector-emitter path of conducting transistor 37 forms a low impedance path to ground to discharge the base charge and minority collector storage charge of transistor 11 and thus, switch the transistor rapidly to a non-conducting condition. It will be clear that the regenerative feedback loop formed by transistors 11 and 12 and resistors 13 and 14 does not determine the switching time of the flip-flop and thus, there is no requirement for "speed-up" capacitors. Resistors 13 and 14 must be of such value that when either one of transistors 11 and 12 is conducting it is saturated.

A further advantage of the binary flip-flop of this invention lies in its operation with very short trigger pulses. If transistors 11 and 12 have an appreciable storage time a short duration trigger pulse may not cause the circuit to change state. To overcome this effect, transistors 37 and 38 may be fabricated to have the same stored charge characteristic as transistors 11 and 12. This has the result that whichever one of transistors 37 and 38 is switched into conduction by the trigger pulse, it will remain conducting, due to its stored charge characteristic, as long as the corresponding one of transistors 11 and 12 remains conducting. This feature compensates for any delay in turning off a conducting transistor in the bistable circuit by providing a switch which has itself the same delay in operation.

Thus, there has been described a binary flip-flop capable of high speed switching and adapted for manufacture by integrated circuit techniques. While in conventional circuit techniques it is uneconomical to alter a circuit by the removal of two capacitors and the substitution of two transistors, this is not so in relation to manufacture by integrated circuit techniques where the component cost of capacitors is substantially the same as that of transistors.

The electronic switches formed by transistors 37 and 38 may also be regarded as inverting amplifiers applying a negative pulse to the base of the conducting transistor in the bistable when a positive trigger pulse is applied to the base of the non-conducting transistor. It will be clear that the entire binary flip-flop circuit may also be constructed using PNP bipolar transistors, field effect transistors, insulated gate transistors or other suitable forms of a three pole normally OFF inverting switch, or replacing each NPN transistor in the circuit described by such a three pole switch.

I claim:

1. A binary flip-flop comprising, a bistable circuit including first and second transistors in a common emitter circuit configuration having their bases and collectors conductively cross-connected to render one of said transistors conductive when the other is non-conductive, and vice versa, first and second steering gates for connecting trigger pulses to the bases of said first and second transistors respectively and conductively connected to said bistable circuit to be selectively enabled at mutually exclusive intervals, a third transistor connected between the base of said first transistor and a point at the reference potential of said common emitter circuit, said third transistor when enabled providing a low impedance discharge path for the base of said first transistor, a fourth transistor connected between the base of said second transistor and said point at said reference potential, said fourth transistor when enabled providing a low impedance discharge path for the base of said second transistor, the base of said third transistor being connected to the base of said second transistor, the base of said fourth transistor being connected to the base of said first transistor.

2. A binary flip-flop as defined in claim 1 wherein said first and third transistors have similar charge storage characteristics and said second and fourth transistors have similar charge storage characteristics.

3. A binary flip-flop as defined in claim 2 wherein said first, second, third and fourth transistors have similar charge storage characteristics.

4. A binary flip-flop as defined in claim 1 further comprising a trigger terminal for connection to a source of trigger pulses and wherein the first and second steering gates are connected between the trigger terminal and bases of said first and second transistors respectively.

References Cited

UNITED STATES PATENTS

| | | | |
|---|---|---|---|
| 2,982,870 | 5/1961 | Hilbiber | 307—292 X |
| 2,991,375 | 7/1961 | Abraham et al. | 307—291 X |
| 2,997,605 | 8/1961 | Fortnini | 307—291 |
| 3,045,128 | 7/1962 | Skerritt | 307—247 |
| 3,238,387 | 3/1966 | Hill | 307—292 |

OTHER REFERENCES

G.E. Transistor Manual, 7th edition, pp. 189, 190 and 199, 1964.

Chirlian, P. M., Analysis and design of Electronic Circuits, New York, McGraw-Hill, 1965, pp. 481 and 482.

ARTHUR GAUSS, Primary Examiner

J. D. FREW, Assistant Examiner

U.S. Cl. X.R.

302—247, 280, 289